United States Patent
Chang

(10) Patent No.: US 11,688,701 B2
(45) Date of Patent: Jun. 27, 2023

(54) SEMICONDUCTOR DEVICES HAVING AN ELECTRO-STATIC DISCHARGE PROTECTION STRUCTURE

(71) Applicant: Taiwan Semiconductor Manufacturing Company Limited, Hsinchu (TW)

(72) Inventor: Yi-Feng Chang, Xinbei (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 229 days.

(21) Appl. No.: 16/945,988

(22) Filed: Aug. 3, 2020

(65) Prior Publication Data

US 2020/0365529 A1 Nov. 19, 2020

Related U.S. Application Data

(62) Division of application No. 14/609,498, filed on Jan. 30, 2015, now Pat. No. 10,734,330.

(51) Int. Cl.
| | |
|---|---|
| *H01L 23/60* | (2006.01) |
| *H01L 23/482* | (2006.01) |
| *H01L 23/522* | (2006.01) |
| *H01L 27/02* | (2006.01) |
| *H01L 21/02* | (2006.01) |

(52) U.S. Cl.
CPC .......... *H01L 23/60* (2013.01); *H01L 23/4824* (2013.01); *H01L 21/02697* (2013.01); *H01L 23/522* (2013.01); *H01L 27/0248* (2013.01)

(58) Field of Classification Search
CPC ... H01L 23/60; H01L 23/4824; H01L 23/522; H01L 21/02697; H01L 27/0248

USPC .......................................................... 257/773
See application file for complete search history.

(56) References Cited

U.S. PATENT DOCUMENTS

| | | | | |
|---|---|---|---|---|
| 5,970,311 | A | * | 10/1999 | Cheek ..................... H01L 22/34 438/18 |
| 2006/0024905 | A1 | | 2/2006 | He et al. |
| 2006/0208962 | A1 | | 9/2006 | Sekiya |
| 2006/0289994 | A1 | | 12/2006 | Greenberg et al. |
| 2007/0075350 | A1 | * | 4/2007 | Darabi .................... H01L 29/94 257/E29.345 |
| 2007/0102765 | A1 | | 5/2007 | Tsai et al. |
| 2007/0155090 | A1 | | 7/2007 | Barth et al. |
| 2007/0228424 | A1 | | 10/2007 | Igarashi |
| 2008/0023792 | A1 | | 1/2008 | Liu et al. |

(Continued)

OTHER PUBLICATIONS

Abu-Abed, A.S., Lindquist, R.G.; Capacitive Interdigital Sensor with Inhomogeneous Nematic Liquid Crystal Film Progress in Electromagnetics Research B, vol. 7; pp. 75-87, 2008.

*Primary Examiner* — Khiem D Nguyen
*Assistant Examiner* — Laura M Dykes
(74) *Attorney, Agent, or Firm* — Jones Day

(57) ABSTRACT

A semiconductor device includes a substrate and a metallization layer. The substrate has an active region that includes opposite first and second edges. The metallization layer is disposed above the substrate, and includes a pair of metal lines and a metal plate. The metal lines extend from an outer periphery of the active region into the active region and toward the second edge of the active region. The metal plate interconnects the metal lines and at least a portion of which is disposed at the outer periphery of the active region.

18 Claims, 9 Drawing Sheets

(56) References Cited

U.S. PATENT DOCUMENTS

| | | |
|---|---|---|
| 2012/0043595 A1 | 2/2012 | Chang et al. |
| 2012/0146093 A1 | 6/2012 | Shibata et al. |
| 2013/0062625 A1 | 3/2013 | Takada |
| 2013/0334658 A1 | 12/2013 | Cai et al. |
| 2014/0001597 A1* | 1/2014 | Huang ................ H01L 21/7682 |
| | | 257/532 |
| 2014/0152379 A1 | 6/2014 | Fujimoto et al. |
| 2015/0341000 A1 | 11/2015 | Kanaya |
| 2016/0020200 A1 | 1/2016 | Risaki |

* cited by examiner

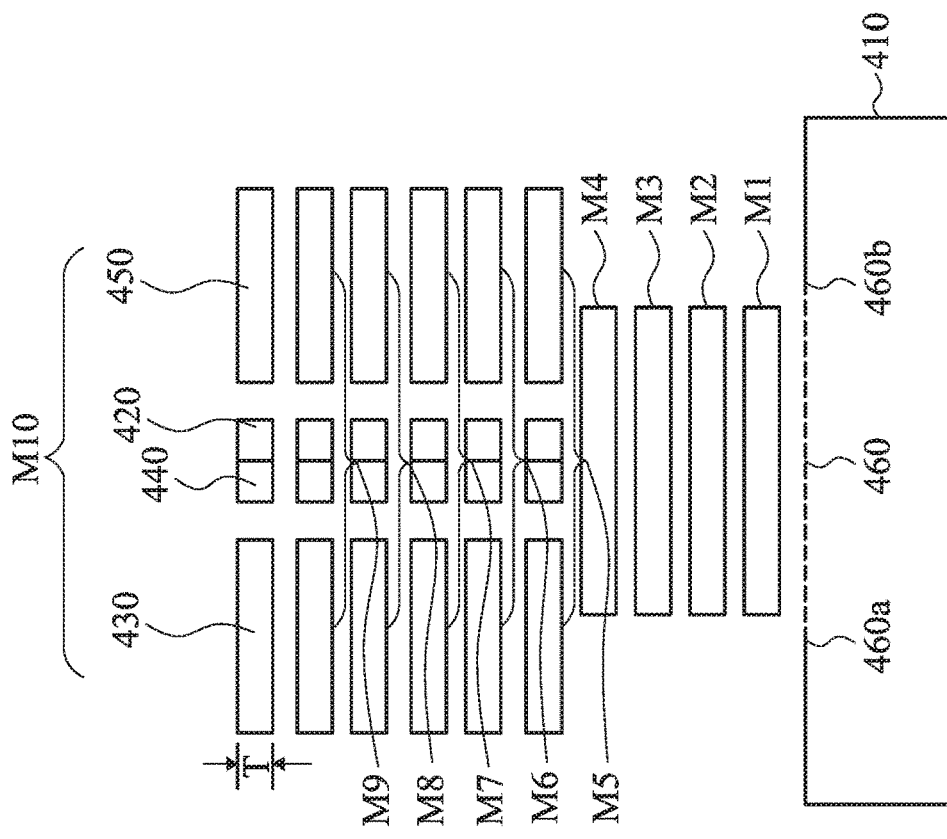
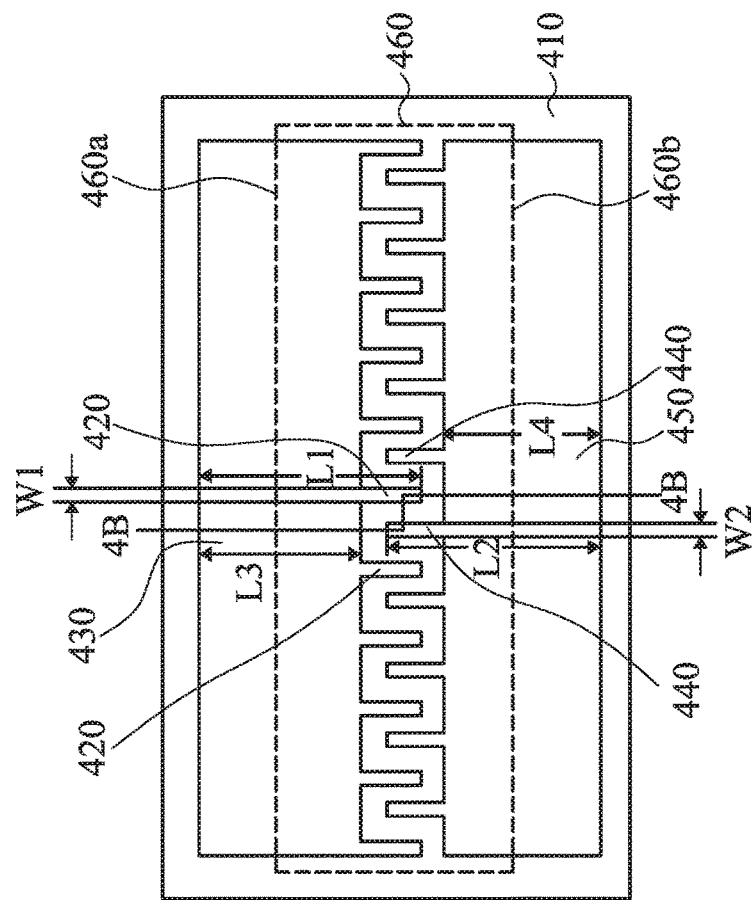
Fig. 4A
Fig. 4B

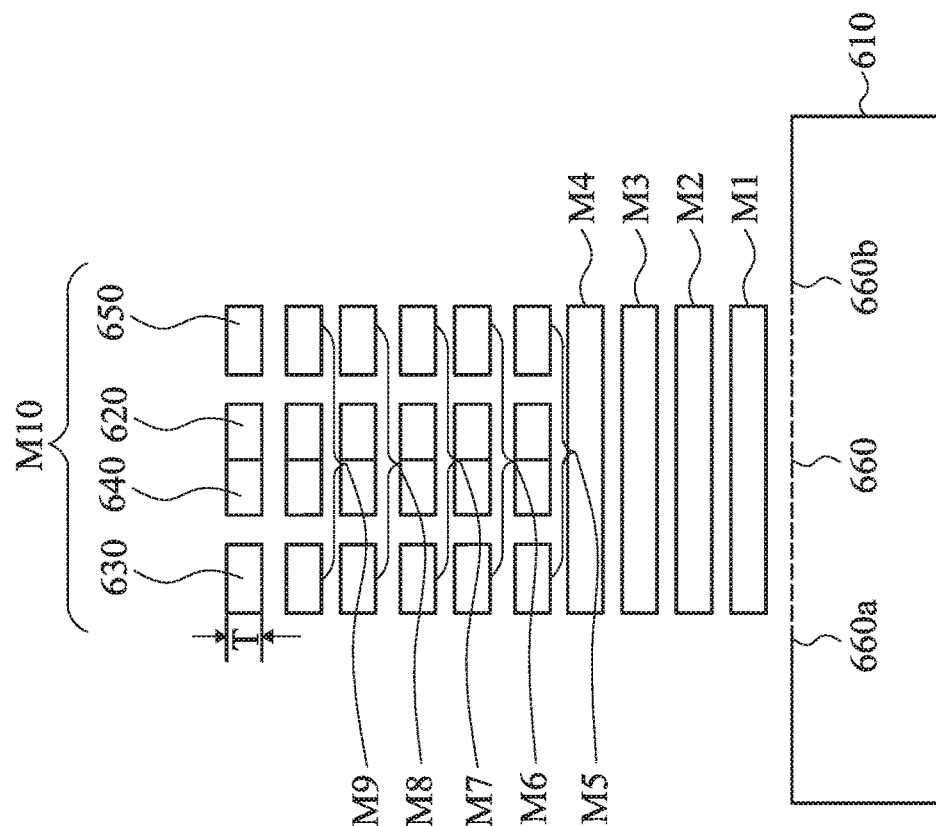
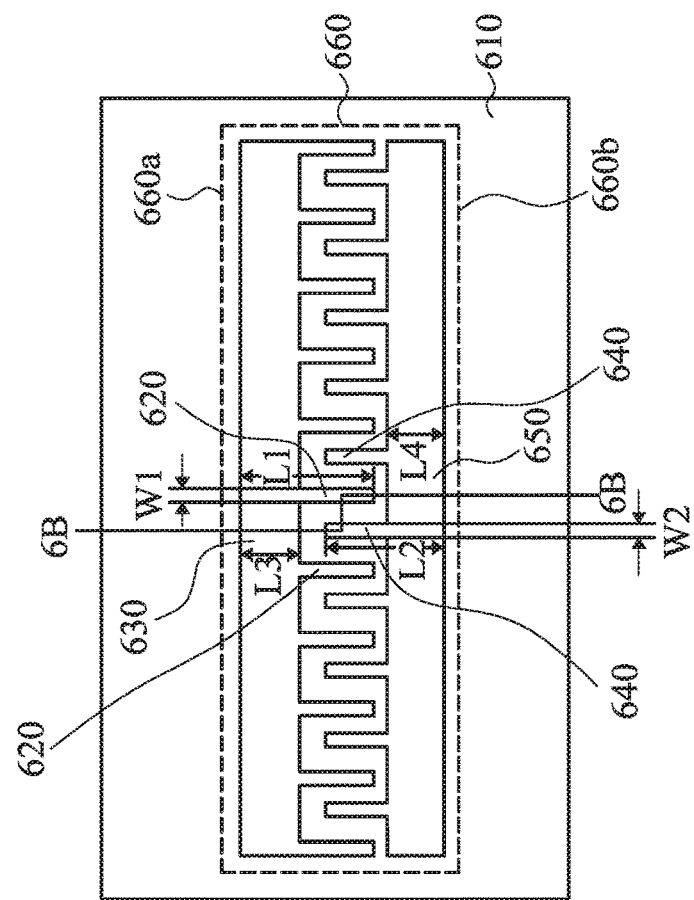
Fig. 6B
Fig. 6A

SEMICONDUCTOR DEVICES HAVING AN ELECTRO-STATIC DISCHARGE PROTECTION STRUCTURE

RELATED APPLICATION

This application is divisional application claiming priority to U.S. patent application Ser. No. 14/609,498 filed on Jan. 30, 2015, the contents of which are hereby fully incorporated by reference.

BACKGROUND

A conventional semiconductor device includes a substrate, a metallization layer that is disposed above the substrate and that includes horizontal interconnects or vertical interconnects, and a plurality of components, e.g., active components, such as transistors, diodes, etc., and/or passive components, such as resistor, capacitors, and inductors, that are disposed between the substrate and the metallization layer and that are electrically connected by the metallization layer. When an electro-static discharge (ESD) surge occurs, the ESD surge may damage the components of the semiconductor device. It is therefore desirable to provide protection for components of semiconductor devices against ESD surges.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4A is a schematic sectional top view of the fourth exemplary semiconductor device in accordance with some embodiments.

FIG. 4B is a schematic sectional view taken along line 4B-4B of FIG. 4A in accordance with some embodiments.

FIG. 6A is a schematic sectional top view of the sixth exemplary semiconductor device in accordance with some embodiments.

FIG. 6B is a schematic sectional view taken along line 6B-6B of FIG. 6A in accordance with some embodiments.

DETAILED DESCRIPTION

Figures 1A, 1B:
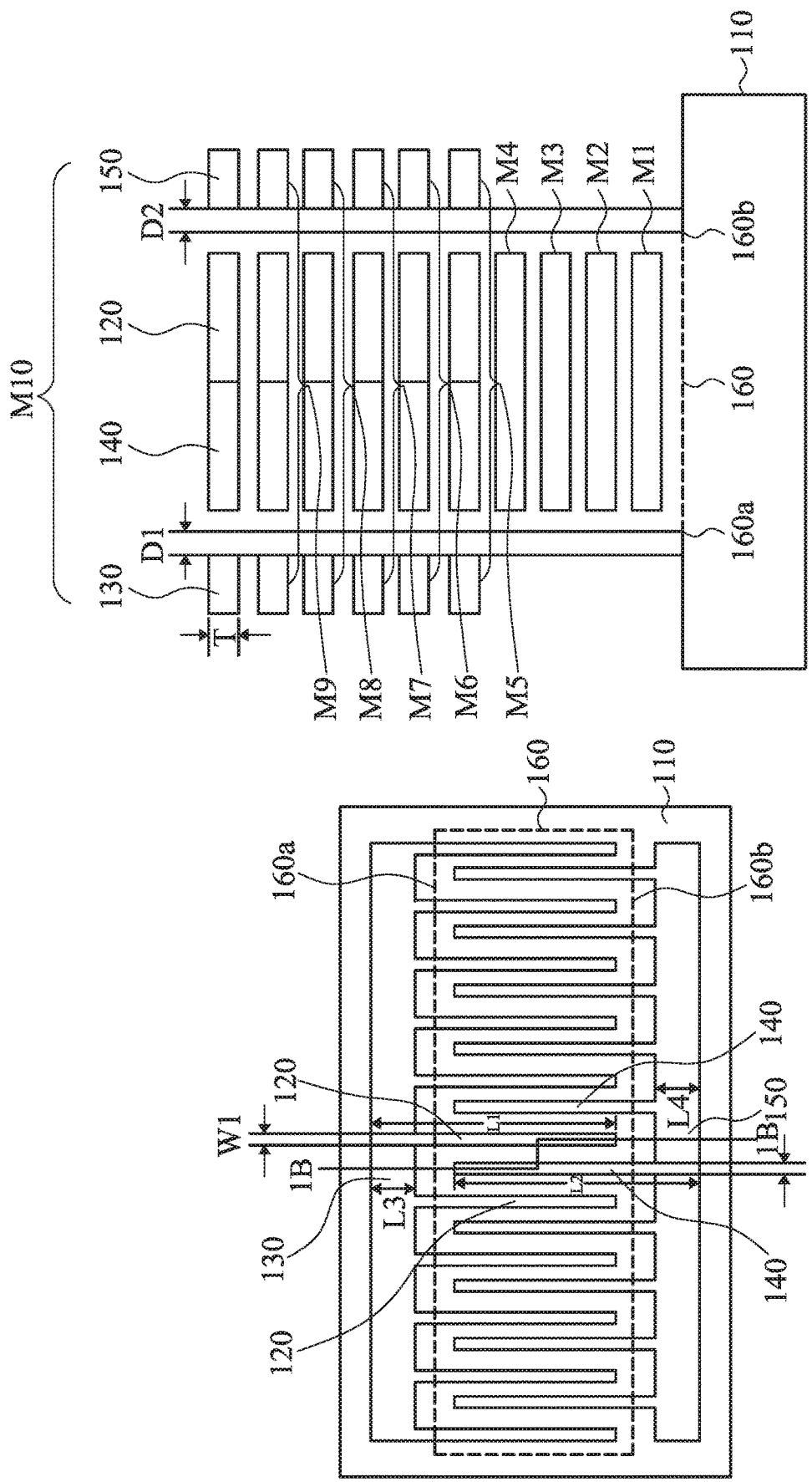
FIG. 1A is a schematic sectional top view of the first exemplary semiconductor device in accordance with some embodiments.
FIG. 1B is a schematic sectional view taken along line 1B-1B of FIG. 1A in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underneath," "below," "lower," "above," "on," "top," "bottom" and the like, may be used herein for ease of description to describe one element or feature's relationship to another element(s) or feature(s) as illustrated in the figures. The spatially relative terms are intended to encompass different orientations of the structure in use or operation in addition to the orientation depicted in the figures. The apparatus may be otherwise oriented (rotated 90 degrees or at other orientations) and the spatially relative descriptors used herein may likewise be interpreted accordingly.

It is observed that when an ESD surge is applied to a semiconductor device the ESD surge causes a sudden rise in a temperature of the semiconductor device. The present disclosure provides a semiconductor device that includes a metallization layer, the structure of which provides protection for components of the semiconductor device from ESD surges. In an exemplary embodiment, the metallization layer includes a pair of metal lines, and a metal plate that interconnects the metal lines. When an ESD surge occurs, current density of current flowing through the metal lines is distributed over the metal plate, thereby efficiently dissipating heat resulting from the ESD surge, whereby the components of the semiconductor device are protected against the ESD surge.

FIG. 1A is a schematic sectional top view of the first exemplary semiconductor device in accordance with some embodiments and FIG. 1B is a schematic sectional view taken along line 1B-1B of FIG. 1A in accordance with some embodiments. As illustrated in FIG. 1B, the semiconductor device includes a substrate 110 and a plurality of metallization layers M5-M10.

The substrate 110 has an active region 160. In an exemplary embodiment, as best shown in FIG. 1A, the active region 160 is generally rectangular, and includes a first edge 160a, and a second edge 160b opposite to the first edge 160a in a direction transverse to a longitudinal direction thereof.

Those skilled in the art will appreciate after reading this disclosure that other shapes for the active region are possible.

The metallization layers M5-M10 are disposed sequentially from bottom to top above the substrate 110. Since the constructions of the metallization layers M5-M10 are substantially the same, only the metallization layer M10 will be described hereinafter.

As best shown in FIG. 1A, the metallization layer M10 includes a pair of first metal lines 120, a first metal plate 130, a pair of second metal lines 140, and a second metal plate 150. The first metal lines 120 and the second metal lines 140 are substantially parallel to each other and are arranged alternately along the length of the active region 160.

The first metal lines 120 extend from an outer periphery of the active region 160 into the active region 160 and toward the second edge 160b of the active region 160. The first metal plate 130 cooperates with the first metal lines 120 to form a generally U-shaped cross section, interconnects sidewalls of the first metal lines 120, and is disposed at the outer periphery of the active region 160. In this exemplary embodiment as seen in the figure, the first metal plate 130 is integral with the first metal lines 120.

The second metal lines 140 extend from the outer periphery of the active region 160 into the active region 160 and toward the first edge 160a of the active region 160. The second metal plate 150 cooperates with the second metal lines 140 to form a generally U-shaped cross section, interconnects sidewalls of the second metal lines 140, and is disposed at the outer periphery of the active region 160. In this exemplary embodiment, the second metal plate 150 is integral with the second metal lines 140.

In this exemplary embodiment, as illustrated in FIG. 1B, the first metal plate 130 and the active region 160 define a distance D1 therebetween of about 0 μm to about 10 μm, the second metal plate 150 and the active region 160 define a distance D2 therebetween of about 0 μm to about 10 μm, and the first and second metal lines 120, 140 and the first and second metal plates 130, 150 have substantially the same thickness T. In another exemplary embodiment (not shown), the first and second metal plates 130, 150 have a thickness different from that of the first and second metal lines 120, 140.

In this exemplary embodiment, as illustrated in FIG. 1A, the first and second metal lines 120, 140 have substantially the same length L1, L2 and width W1, W2 and the first and second metal plates 130, 150 have substantially the same length L3, L4. In another exemplary embodiment, the first metal lines 120 have a length L1 different from a length L2 of the second metal lines 140. In another exemplary embodiment, the first metal lines 120 have a width W1 different from a width W2 of the second metal lines 140. In another exemplary embodiment, the first metal plate 130 has a length L3 different from a length L4 of the second metal plate 150.

Figures 2A, 2B:
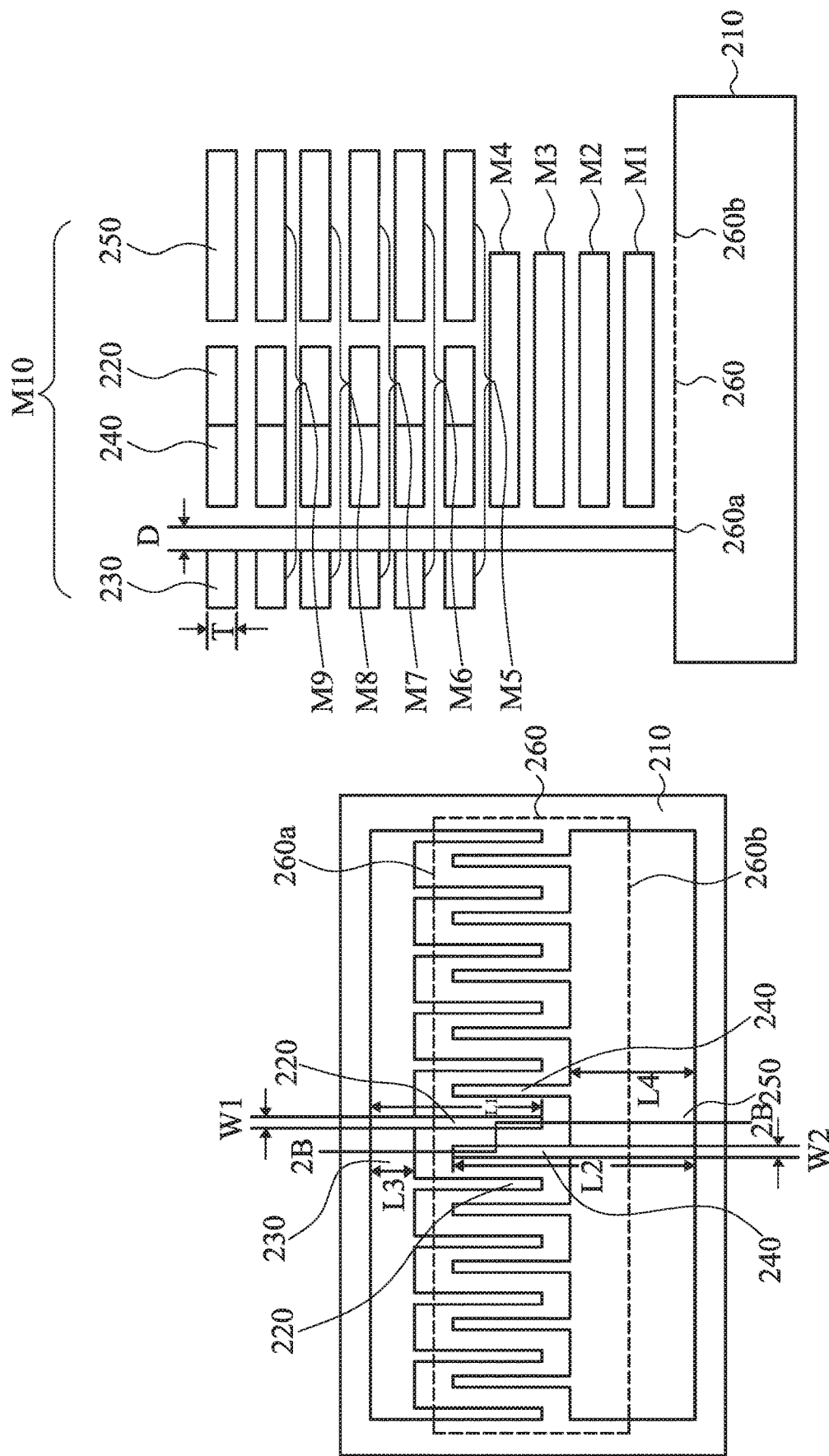
FIG. 2A is a schematic sectional top view of the second exemplary semiconductor device in accordance with some embodiments.
FIG. 2B is a schematic sectional view taken along line 2B-2B of FIG. 2A in accordance with some embodiments.

FIG. 2A is a schematic sectional top view of the second exemplary semiconductor device in accordance with some embodiments and FIG. 2B is a schematic sectional view taken along line 2B-2B of FIG. 2A in accordance with some embodiments. As illustrated in FIG. 2B, the semiconductor device includes a substrate 210 and a plurality of metallization layers M5-M10.

The substrate 210 has an active region 260. In an exemplary embodiment, as best shown in FIG. 2A, the active region 260 is generally rectangular, and includes a first edge 260a, and a second edge 260b opposite to the first edge 260a in a direction transverse to a longitudinal direction thereof.

The metallization layers M5-M10 are disposed sequentially from bottom to top above the substrate 210. Since the constructions of the metallization layers M5-M10 are substantially the same, only the metallization layer M10 will be described hereinafter.

As best shown in FIG. 2A, the metallization layer M10 includes a pair of first metal lines 220, a first metal plate 230, a pair of second metal lines 240, and a second metal plate 250. The first metal lines 220 and the second metal lines 240 are substantially parallel to each other and are arranged alternately along the length of the active region 260.

The first metal lines 220 extend from an outer periphery of the active region 260 into the active region 260 and toward the second edge 260b of the active region 260. The first metal plate 230 cooperates with the first metal lines 220 to form a generally U-shaped cross section, interconnects sidewalls of the first metal lines 220, and is disposed at the outer periphery of the active region 260. In this exemplary embodiment, the first metal plate 230 is integral with the first metal lines 220.

The second metal lines 240 extend from the outer periphery of the active region 260 into the active region 260 and toward the first edge 260a of the active region 260. The second metal plate 250 cooperates with the second metal lines 240 to form a generally U-shaped cross section, interconnects sidewalls of the second metal lines 240, and extends from the outer periphery of the active region 260 into the active region 260, e.g., to an inner periphery of the active region 260. In this exemplary embodiment, the second metal plate 250 is integral with the second metal lines 240.

In this exemplary embodiment, as illustrated in FIG. 2B, the first metal plate 230 and the active region 260 define a distance D therebetween of about 0 μm to about 10 μm and the first and second metal lines 220, 240 and the first and second metal plates 230, 250 have substantially the same thickness T. In another exemplary embodiment, the first and second metal plates 230, 250 have a thickness different from that of the first and second metal lines 220, 240.

In this exemplary embodiment, as illustrated in FIG. 2A, the first metal lines 220 have a length L1 shorter than a length L2 of the second metal lines 240, the first and second metal lines 220, 240 have substantially the same width W1, W2, and the first metal plate 230 has a length L3 shorter than a length L4 of the second metal plate 250. In another exemplary embodiment, the first and second metal lines 220, 240 have substantially the same length L1, L2. In another exemplary embodiment, the first metal lines 220 have a length L1 longer than a length L2 of the second metal lines 240. In another exemplary embodiment, the first metal lines 220 have a width W1 different from a width W2 of the second metal lines 240. In another exemplary embodiment, the first and second metal plates 230, 250 have substantially the same length L3, L4. In another exemplary embodiment, the first metal plate 230 has a length L3 longer than a length L4 of the second metal plate 250.

Figures 3A, 3B:
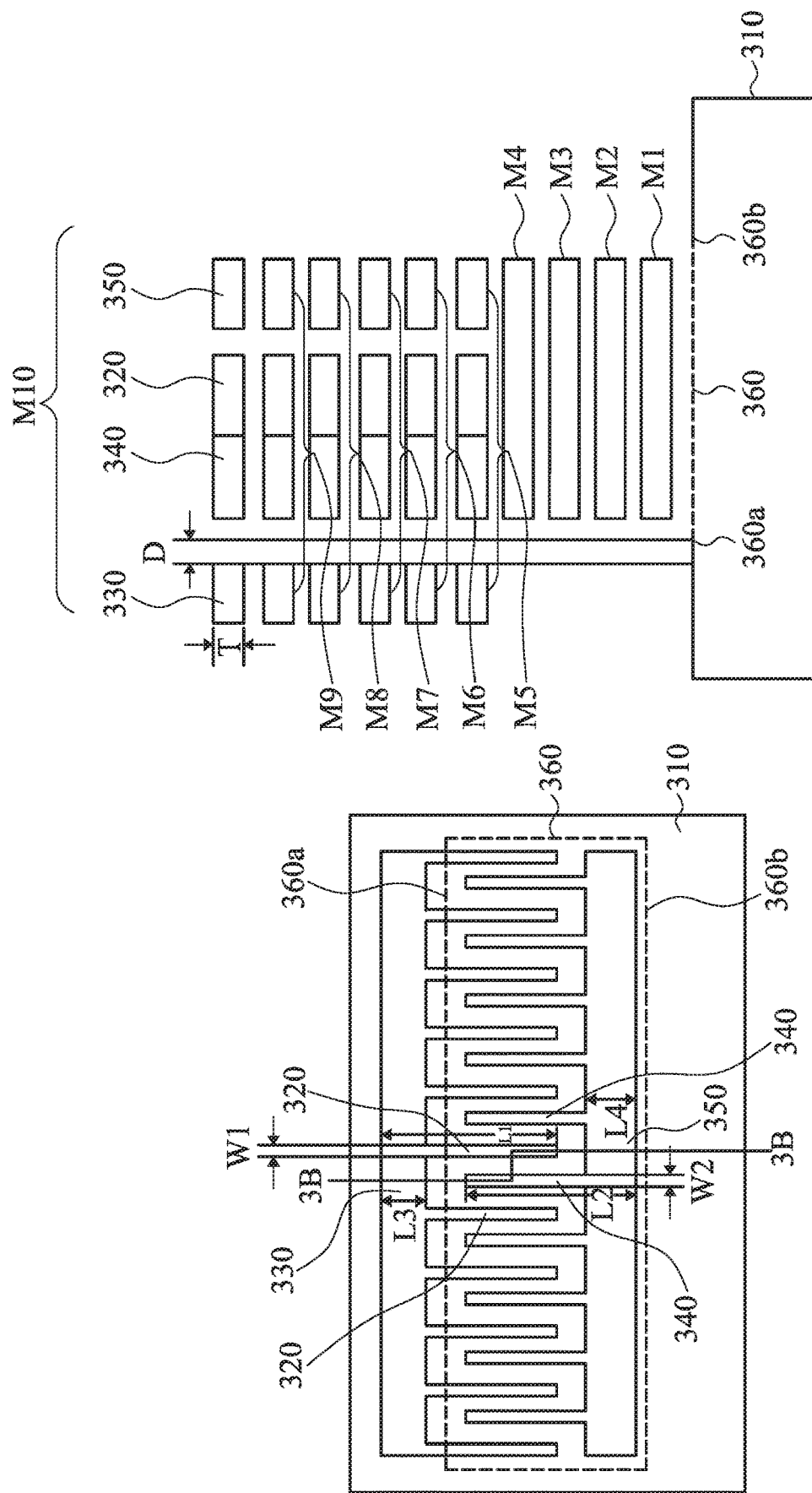
FIG. 3A is a schematic sectional top view of the third exemplary semiconductor device in accordance with some embodiments.
FIG. 3B is a schematic sectional view taken along line 3B-3B of FIG. 3A in accordance with some embodiments.

FIG. 3A is a schematic sectional top view of the third exemplary semiconductor device in accordance with some embodiments and FIG. 3B is a schematic sectional view taken along line 3B-3B of FIG. 3A in accordance with some embodiments. As illustrated in FIG. 3B, the semiconductor device includes a substrate 310 and a plurality of metallization layers M5-M10.

The substrate 310 has an active region 360. In an exemplary embodiment, as best shown in FIG. 3A, the active region 360 is generally rectangular, and includes a first edge 360a, and a second edge 360b opposite to the first edge 360a in a direction transverse to a longitudinal direction thereof.

The metallization layers M5-M10 are disposed sequentially from bottom to top above the substrate 310. Since the constructions of the metallization layers M5-M10 are substantially the same, only the metallization layer M10 will be described hereinafter.

As best shown in FIG. 3A, the metallization layer M10 includes a pair of first metal lines 320, a first metal plate 330, a pair of second metal lines 340, and a second metal plate 350. The first metal lines 320 and the second metal lines 340 are substantially parallel to each other and are arranged alternately along the length of the active region 360.

The first metal lines 320 extend from an outer periphery of the active region 360 into the active region 360 and toward the second edge 360b of the active region 360. The first metal plate 330 cooperates with the first metal lines 320 to form a generally U-shaped cross section, interconnects sidewalls of the first metal lines 320, and is disposed at the outer periphery of the active region 360. In this exemplary embodiment, the first metal plate 330 is integral with the first metal lines 320.

The second metal lines 340 extend from an inner periphery of the active region 360 toward the first edge 360a of the active region 360. The second metal plate 350 cooperates with the second metal lines 340 to form a generally U-shaped cross section, interconnects sidewalls of the second metal lines 340, and is disposed at the inner periphery of the active region 360. In this exemplary embodiment, the second metal plate 350 is integral with the second metal lines 340.

In this exemplary embodiment, as illustrated in FIG. 3B, the first metal plate 330 and the active region 360 define a distance D therebetween of about 0 μm to about 10 μm and the first and second metal lines 320, 340 and the first and second metal plates 330, 350 have substantially the same thickness T. In another exemplary embodiment, the first and second metal plates 330, 350 have a thickness different from that of the first and second metal lines 320, 340.

In this exemplary embodiment, as illustrated in FIG. 3A, the first and second metal lines 320, 340 have substantially the same length L1, L2 and width W1, W2 and the first and second metal plates 330, 350 have substantially the same length L3, L4. In another exemplary embodiment, the first metal lines 320 have a length L1 different from a length L2 of the second metal lines 340. In another exemplary embodiment, the first metal lines 320 have a width W1 different from a width W2 of the second metal lines 340. In another exemplary embodiment, the first metal plate 330 has a length L3 different from a length L4 of the second metal plate 350.

FIG. 4A is a schematic sectional top view of the fourth exemplary semiconductor device in accordance with some embodiments and FIG. 4B is a schematic sectional view taken along line 4B-4B of FIG. 4A in accordance with some embodiments. As illustrated in FIG. 4B, the semiconductor device includes a substrate 410 and a plurality of metallization layers M5-M10.

The substrate 410 has an active region 460. In an exemplary embodiment, as best shown in FIG. 4A, the active region 460 is generally rectangular, and includes a first edge 460a, and a second edge 460b opposite to the first edge 460a in a direction transverse to a longitudinal direction thereof.

The metallization layers M5-M10 are disposed sequentially from bottom to top above the substrate 410. Since the constructions of the metallization layers M5-M10 are substantially the same, only the metallization layer M10 will be described hereinafter.

As best shown in FIG. 4A, the metallization layer M10 includes a pair of first metal lines 420, a first metal plate 430, a pair of second metal lines 440, and a second metal plate 450. The first metal lines 420 and the second metal lines 440 are substantially parallel to each other and are arranged alternately along the length of the active region 460.

The first metal lines 420 extend from an outer periphery of the active region 460 into the active region 460 and toward the second edge 460b of the active region 460. The first metal plate 430 cooperates with the first metal lines 420 to form a generally U-shaped cross section, interconnects sidewalls of the first metal lines 420, and extends from the outer periphery of the active region 460 into the active region 460, e.g., to an inner periphery of the active region 460. In this exemplary embodiment, the first metal plate 430 is integral with the first metal lines 420.

The second metal lines 440 extend from the outer periphery of the active region 460 into the active region 460 and toward the first edge 460a of the active region 460. The second metal plate 450 cooperates with the second metal lines 440 to form a generally U-shaped cross section, interconnects sidewalls of the second metal lines 440, and extends from the outer periphery of the active region 460 into the active region 460, e.g., to the inner periphery of the active region 460. In this exemplary embodiment, the second metal plate 450 is integral with the second metal lines 440.

In this exemplary embodiment, as illustrated in FIG. 4B, the first and second metal lines 420, 440 and the first and second metal plates 430, 450 have substantially the same thickness T. In another exemplary embodiment, the first and second metal plates 430, 450 have a thickness different from that of the first and second metal lines 420, 440.

In this exemplary embodiment, as illustrated in FIG. 4A, the first and second metal lines 420, 440 have substantially the same length L1, L2 and width W1, W2 and the first and second metal plates 430, 450 have substantially the same length L3, L4. In another exemplary embodiment, the first metal lines 420 have a length L1 different from a length L2 of the second metal lines 440. In another exemplary embodiment, the first metal lines 420 have a width W1 different from a width W2 of the second metal lines 440. In another exemplary embodiment, the first metal plate 430 has a length L3 different from a length L4 of the second metal plate 450.

Figures 5A, 5B:
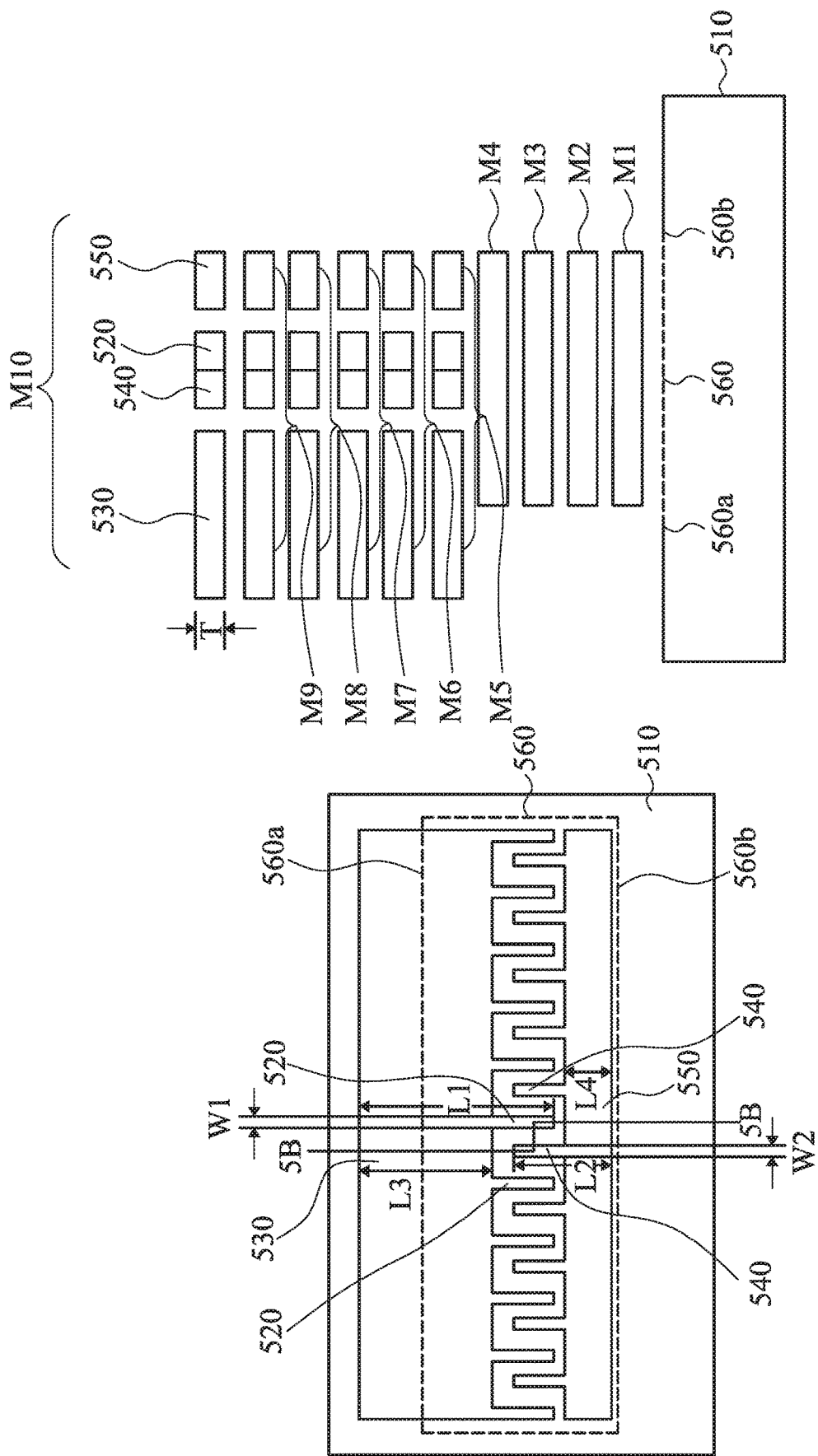
FIG. 5A is a schematic sectional top view of the fifth exemplary semiconductor device in accordance with some embodiments.
FIG. 5B is a schematic sectional view taken along line 5B-5B of FIG. 5A in accordance with some embodiments.

FIG. 5A is a schematic sectional top view of the fifth exemplary semiconductor device in accordance with some embodiments and FIG. 5B is a schematic sectional view taken along line 5B-5B of FIG. 5A in accordance with some embodiments. As illustrated in FIG. 5B, the semiconductor device includes a substrate 510 and a plurality of metallization layers M5-M10.

The substrate 510 has an active region 560. In an exemplary embodiment, as best shown in FIG. 5A, the active region 560 is generally rectangular, and includes a first edge 560a, and a second edge 560b opposite to the first edge 560a in a direction transverse to a longitudinal direction thereof.

The metallization layers M5-M10 are disposed sequentially from bottom to top above the substrate 510. Since the constructions of the metallization layers M5-M10 are substantially the same, only the metallization layer M10 will be described hereinafter.

As best shown in FIG. 5A, the metallization layer M10 includes a pair of first metal lines 520, a first metal plate 530, a pair of second metal lines 540, and a second metal plate 550. The first metal lines 520 and the second metal lines 540 are substantially parallel to each other and are arranged alternately along the length of the active region 560.

The first metal lines 520 extend from an outer periphery of the active region 560 into the active region 560 and toward the second edge 560*b* of the active region 560. The first metal plate 530 cooperates with the first metal lines 520 to form a generally U-shaped cross section, interconnects sidewalls of the first metal lines 520, and extends from the outer periphery of the active region 560 into the active region 560, e.g., to an inner periphery of the active region 560. In this exemplary embodiment, the first metal plate 530 is integral with the first metal lines 520.

The second metal lines 540 extend from the inner periphery of the active region 560 toward the first edge 560*a* of the active region 560. The second metal plate 550 cooperates with the second metal lines 540 to form a generally U-shaped cross section, interconnects sidewalls of the second metal lines 540, and is disposed at the inner periphery of the active region 560. In this exemplary embodiment, the second metal plate 550 is integral with the second metal lines 540.

In this exemplary embodiment, as illustrated in FIG. 5B, the first and second metal lines 520, 540 and the first and second metal plates 530, 550 have substantially the same thickness T. In another exemplary embodiment, the first and second metal plates 530, 550 have a thickness different from that of the first and second metal lines 520, 540.

In this exemplary embodiment, as illustrated in FIG. 5A, the first metal lines 520 have a length L1 longer than a length L2 of the second metal lines 540, the first and second metal lines 520, 540 have substantially the same width W1, W2, and the first metal plate 530 has a length L3 longer than a length L4 of the second metal plate 550. In another exemplary embodiment, the first and second metal lines 520, 540 have substantially the same length L1, L2. In another exemplary embodiment, the first metal lines 520 have a length L1 shorter than a length L2 of the second metal lines 540. In another exemplary embodiment, the first metal lines 520 have a width W1 different from a width W2 of the second metal lines 540. In another exemplary embodiment, the first and second metal plates 530, 550 have substantially the same length L3, L4. In another exemplary embodiment, the first metal plate 530 has a length L3 shorter than a length L4 of the second metal plate 550.

FIG. 6A is a schematic sectional top view of the sixth exemplary semiconductor device in accordance with some embodiments and FIG. 6B is a schematic sectional view taken along line 6B-6B of FIG. 6A in accordance with some embodiments. As illustrated in FIG. 6B, the semiconductor device includes a substrate 610 and a plurality of metallization layers M5-M10.

The substrate 610 has an active region 660. In an exemplary embodiment, as best shown in FIG. 6A, the active region 660 is generally rectangular, and includes a first edge 660*a*, and a second edge 660*b* opposite to the first edge 660*a* in a direction transverse to a longitudinal direction thereof.

The metallization layers M5-M10 are disposed sequentially from bottom to top above the substrate 610. Since the constructions of the metallization layers M5-M10 are substantially the same, only the metallization layer M10 will be described hereinafter.

As best shown in FIG. 6A, the metallization layer M10 includes a pair of first metal lines 620, a first metal plate 630, a pair of second metal lines 640, and a second metal plate 650. The first metal lines 620 and the second metal lines 640 are substantially parallel to each other and are arranged alternately along the length of the active region 660.

The first metal lines 620 extend from an inner periphery of the active region 660 toward the second edge 660*b* of the active region 660. The first metal plate 630 cooperates with the first metal lines 620 to form a generally U-shaped cross section, interconnects sidewalls of the first metal lines 620, and is disposed at the inner periphery of the active region 660. In this exemplary embodiment, the first metal plate 630 is integral with the first metal lines 620.

The second metal lines 640 extend from the inner periphery of the active region 660 toward the first edge 660*a* of the active region 660. The second metal plate 650 cooperates with the second metal lines 640 to form a generally U-shaped cross section, interconnects sidewalls of the second metal lines 640, and is disposed at the inner periphery of the active region 660. In this exemplary embodiment, the second metal plate 650 is integral with the second metal lines 640.

In this exemplary embodiment, as illustrated in FIG. 6B, the first and second metal lines 620, 640 and the first and second metal plates 630, 650 have substantially the same thickness T. In another exemplary embodiment, the first and second metal plates 630, 650 have a thickness different from that of the first and second metal lines 620, 640.

In this exemplary embodiment, as illustrated in FIG. 6A, the first and second metal lines 620, 640 have substantially the same length L1, L2 and width W1, W2 and the first and second metal plates 630, 650 have substantially the same length L3, L4. In another exemplary embodiment, the first metal lines 620 have a length L1 different from a length L2 of the second metal lines 640. In another exemplary embodiment, the first metal lines 620 have a width W1 different from a width W2 of the second metal lines 640. In another exemplary embodiment, the first metal plate 630 has a length L3 different from a length L4 of the second metal plate 650.

Figure 7:
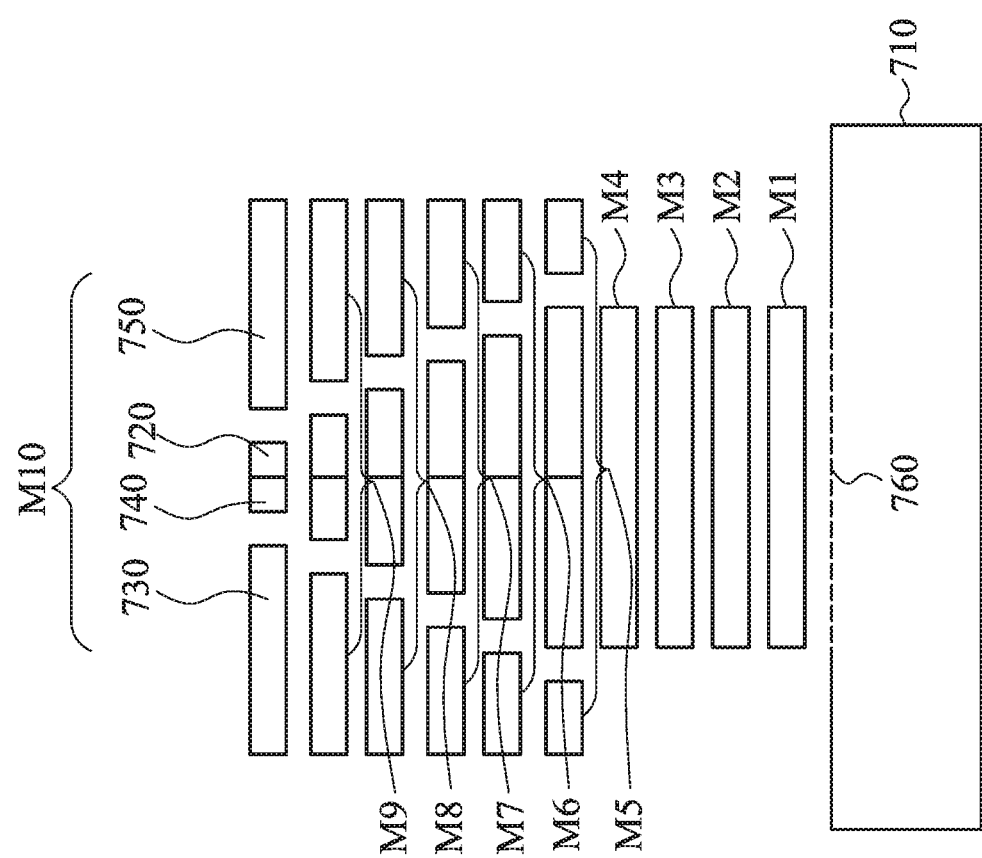
FIG. 7 is a schematic sectional side view of the seventh exemplary semiconductor device in accordance with some embodiments.

FIG. 7 is a schematic sectional side view of the seventh exemplary semiconductor device in accordance with some embodiments. As illustrated in FIG. 7, the semiconductor device includes a substrate 710 and a plurality of metallization layers M5-M10.

The metallization layers M5-M10 are disposed sequentially from bottom to top above the substrate 710. As in the exemplary embodiments described above with reference to FIGS. 1A-6A and 1B-6B, each of the metallization layers M5-M10 of this exemplary embodiment includes a pair of first metal lines 720, a first metal plate 730 that interconnects the first metal lines 720, a pair of second metal lines 740, and a second metal plate 750 that interconnects the second metal lines 740 (only the metal lines and metal plates of the metallization layer M10 are identified by reference numerals in FIG. 7).

In this exemplary embodiment, as illustrated in FIG. 7, the first metal plate 730 of an overlying metallization layer, e.g., M10, of an adjacent pair of the metallization layers, e.g., M9 and M10, has a length longer than that of the first metal plate of an underlying metallization layer, e.g., M9, of the adjacent pair of the metallization layers, e.g., M9 and M10. Also, in this exemplary embodiment, the second metal plate 750 of an overlying metallization layer, e.g., M10, of an adjacent pair of the metallization layers, e.g., M9 and M10, has a length longer than that of the second metal plate of an underlying metallization layer, e.g., M9, of the adjacent pair of the metallization layers, e.g., M9 and M10.

Figure 8:
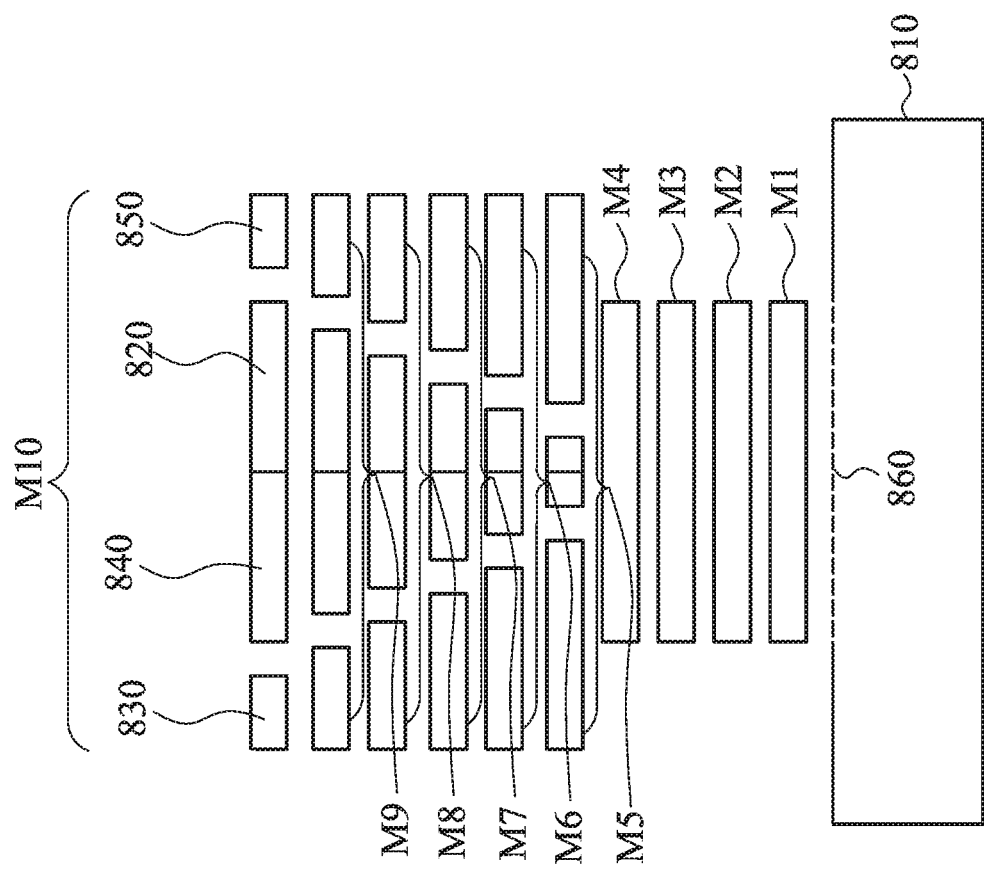
FIG. 8 is a schematic sectional side view of the eighth exemplary semiconductor device in accordance with some embodiments.

FIG. 8 is a schematic sectional side view of the eighth exemplary semiconductor device in accordance with some embodiments. As illustrated in FIG. 8, the semiconductor device includes a substrate 810 and a plurality of metallization layers M5-M10.

The metallization layers M5-M10 are disposed sequentially from bottom to top above the substrate 810. As in the exemplary embodiments described above with reference to FIGS. 1A-6A, 1B-6B, and 7, each of the metallization layers M5-M10 of this exemplary embodiment includes a pair of first metal lines 820, a first metal plate 830 that interconnects the first metal lines 820, a pair of second metal lines 840, and a second metal plate 850 that interconnects the second metal lines 840 (only the metal lines and metal plates of the metallization layer M10 are identified by reference numerals in FIG. 8).

In this exemplary embodiment, as illustrated in FIG. 8, the first metal plate 830 of an overlying metallization layer, e.g., M10, of an adjacent pair of the metallization layers, e.g., M9 and M10, has a length shorter than that of the first metal plate of an underlying metallization layer, e.g., M9, of the adjacent pair of the metallization layers, e.g., M9 and M10. Also, in this exemplary embodiment, the second metal plate 850 of an overlying metallization layer, e.g., M10, of an adjacent pair of the metallization layers, e.g., M9 and M10, has a length shorter than that of the second metal plate of an underlying metallization layer, e.g., M9, of the adjacent pair of the metallization layers, e.g., M9 and M10.

In the exemplary embodiments described above with reference to FIGS. 1A-6A, 1B-6B, 7, and 8, the semiconductor device further includes a plurality of diodes (not shown), a plurality of second metallization layers M1-M4, a plurality of third metallization layers (not shown), and a dielectric layer (not shown).

The diodes are disposed in the active region. In this exemplary embodiment, one of the first metal line 120, 220, 320, 420, 520, 620, 720, 820 and the second metal line 140, 240, 340, 440, 540, 640, 740, 840 serves as anodes of the diodes, and the other of the first metal line 120, 220, 320, 420, 520, 620, 720, 820 and the second metal line 140, 240, 340, 440, 540, 640, 740, 840 serves as cathodes of the diodes. In another exemplary embodiment, the semiconductor device further includes transistors, another active component, capacitors, resistors, inductors, another passive component, or a combination thereof.

In the exemplary embodiments described above with reference to FIGS. 1A-6A, 1B-6B, 7, and 8, the first and second metal lines 120, 220, 320, 420, 520, 620, 720, 820, 140, 240, 340, 440, 540, 640, 740, 840 and the first and second metal plates 130, 230, 330, 430, 530, 630, 730, 830, 150, 250, 350, 450, 550, 650, 750, 850 of the metallization layers M5-M10 serve as horizontal interconnects.

The second metallization layers M1-M4 are disposed sequentially from bottom to top between the substrate 110, 210, 310, 410, 510, 610, 710, 810 and the metallization layer M5. Each of the second metallization layers M1-M4 includes a plurality of metal lines that are parallel to each other, that are arranged along the length of the active region 160, 260, 360, 460, 560, 660, 760, 860, and that serve as horizontal interconnects.

Each of the third metallization layers is disposed between an adjacent pair of the metallization layers M1-M10 and includes at least one vertical interconnect, i.e., via.

The dielectric layer surrounds the diodes, the metallization layers M5-M10, the second metallization layers M1-M4, and the third metallization layers.

Figure 9:
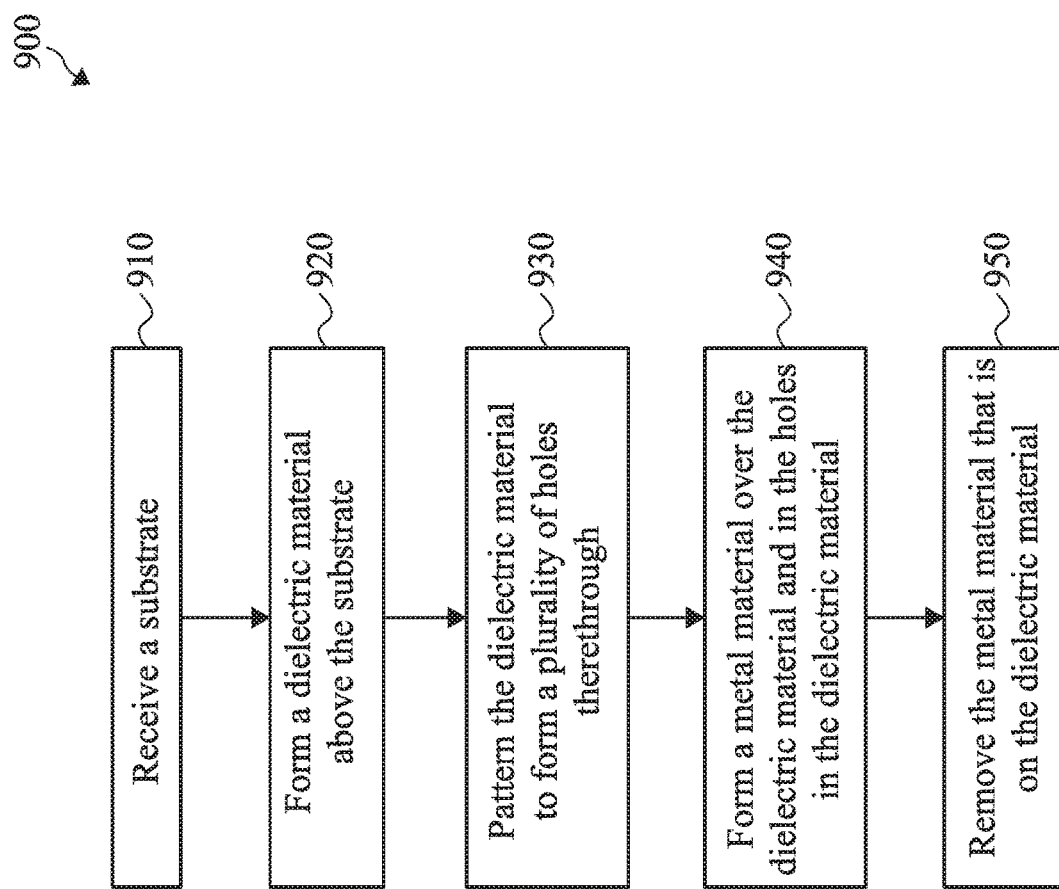
FIG. 9 is a flowchart illustrating an exemplary method of fabricating a semiconductor device in accordance with some embodiments.

FIG. 9 is a flowchart illustrating a method 900 of fabricating a semiconductor device in accordance with some embodiments. It is understood that additional operations may be performed before, during, and/or after the method 900 and that some other process may only be briefly described herein.

As illustrated in FIG. 9, the method 900 begins with operation 910 in which a substrate is received. The substrate has an active region that includes opposite first and second edges. In some embodiments, the substrate is a bulk substrate. Examples of materials for the bulk substrate include, but are not limited to, Si, Ge, another semiconductor material, and an alloy thereof. In some embodiments, the substrate is a semiconductor-on-insulator (SOI) substrate. The method 900 continues with operation 920 in which a dielectric material is formed above the substrate. Examples of dielectric materials include, but are not limited to, SiO, SiN, SiON, SiC, SiOC, phosphosilicate glass (PSG), borophosphosilicate glass (BPSG), and the like. The dielectric material is formed using chemical vapor deposition (CVD), spin-on, sputtering, or other suitable deposition processes. The method 900 continues with operation 930 in which the dielectric material is patterned, e.g., using lithographic and etching processes, to form a plurality of holes therethrough. The method 900 continues with operation 940 in which a metal material is formed over the dielectric material and in the holes in the dielectric material. Examples of metal materials include, but are not limited to, W, Ni, Ti, Mo, Ta, Cu, Pt, Ag, Au, Ru, Ir, Rh, Re, another metal material, an alloy of metal material and semiconductor material, and a combination thereof. The method 900 continues with operation 950 in which the metal material that is on the dielectric material is removed. The metal material that is in the holes in the dielectric material serves as a metallization layer, e.g., the metallization layer M10 of FIG. 1A-6A, 1B-6B, 7, or 8.

In some embodiments, the method 900 further includes the operations of: forming a second dielectric material above the substrate; patterning the second dielectric material to form a plurality of holes therethrough; forming a second metal material over the second dielectric material and in the holes in the second dielectric material; and removing the second metal material that is on the second dielectric material. The second metal material that is in the holes in the second dielectric material serves another metallization layer, e.g., the metallization layer M9 of FIG. 1A-6A, 1B-6B, 7, or 8.

In some embodiments, the method 900 further includes the operations of: forming a third dielectric material above the substrate; patterning the third dielectric material to form a plurality of holes therethrough; forming a third metal material over the third dielectric layer and in the holes in third dielectric layer; and removing the third metal material that is on the third dielectric layer. The third metal material that is in the holes in the third dielectric material serves another metallization layer, e.g., the metallization layer M1 of FIG. 1A-6A, 1B-6B, 7, or 8.

Based on experimental results, when an ESD surge is applied to the conventional semiconductor device, current density of current flowing through the metallization layer thereof and temperatures of the metallization layer and the substrate thereof are approximately 3.9 E7 A/cm$^2$, 127° C., and 77° C., respectively, whereas when an ESD surge is applied to the semiconductor device of the present disclosure, current density of current flowing through the metallization layer thereof and temperatures of the metallization layer and the substrate thereof are approximately 2.9 E6 A/cm$^2$, 65° C., and 62° C., respectively. The structures of the metallization layers of the semiconductor device of the present disclosure are capable of providing protection for the components of the semiconductor device from ESD surges.

Those skilled in the art will readily appreciate that, after reading this disclosure, the structure of the metallization layer described in an exemplary embodiment may be combined with that in another exemplary embodiment. For example, in a further exemplary embodiment, the first/ second metal plates of some of the metallization layers may have substantially the same length, as in the first-sixth exemplary embodiments, while the first/second metal plates of the other of the metallization layers may have different lengths, as in the seventh and eighth exemplary embodiments. As another example, in another further exemplary embodiment, the first and second metal plates of some of the metallization layers may be disposed at the outer periphery of the active region, as in the first exemplary embodiment, while the first and second metal plates of the other of the metallization layers may be disposed at the inner periphery of the active region, as in the sixth exemplary embodiment.

In an exemplary embodiment of a semiconductor device, the semiconductor device comprises a substrate and a metallization layer. The substrate has an active region that includes opposite first and second edges. The metallization layer is disposed above the substrate, and includes a pair of metal lines that extend from an outer periphery of the active region into the active region and toward the second edge of the active region, and a metal plate that interconnects the metal lines, wherein at least a portion of the metal plate is disposed at the outer periphery of the active region.

In another exemplary embodiment of a semiconductor device, the semiconductor device comprises a substrate and a metallization layer. The substrate has an active region that includes opposite first and second edges. The metallization layer is disposed above the substrate, and includes a pair of metal lines that extend from an inner periphery of the active region toward the second edge of the active region, and a metal plate that interconnects the metal lines and that is disposed at the inner periphery of the active region.

In an exemplary embodiment of a method of fabricating a semiconductor device, the method comprises: receiving a substrate having an active region that includes opposite first and second edges; forming a dielectric material above the substrate; patterning the dielectric material to form a plurality of holes therethrough; forming a metal material over the dielectric material and in the holes in the dielectric material; and removing the metal material that is on the dielectric material, wherein the metal material that is in the holes includes a pair of metal lines that extend toward the second edge of the active region, and a metal plate that interconnects the metal lines and that is disposed at at least one of outer and inner peripheries of the active region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a semiconductor device, the method comprising:
    receiving a substrate having an active region that includes opposite first and second edges;
    forming a dielectric material above the substrate;
    patterning the dielectric material to form a plurality of first holes therethrough;
    forming a first metal material over the dielectric material and in the first holes in the dielectric material;
    removing the first metal material that is on the dielectric material, wherein the first metal material that is in the first holes in the dielectric material includes
        a pair of first metal lines that extend toward the second edge of the active region, and
        a first metal plate that horizontally interconnects the pair of first metal lines;
    forming a second dielectric material above the substrate;
    patterning the second dielectric material to form a plurality of second holes therethrough;
    forming a second metal material over the second dielectric material and in the second holes in the second dielectric material; and
    removing the second metal material that is on the second dielectric material,
    wherein:
        the second metal material that is in the second holes in the second dielectric material includes
            a pair of second metal lines that extend toward the second edge of the active region,
            a second metal plate that horizontally interconnects the pair of second metal lines of the second metal material, and
            a plurality of distinct metal lines that are parallel to each other and arranged along a length of the active region underneath all of the first pair of metal lines and the second pair of metal lines,
    wherein:
        the plurality of distinct metal lines have a length that extends, on a first end, from a position underneath an intermediate portion of the first metal plate to, on a second end, a position underneath an intermediate portion of the second metal plate,
        the plurality of distinct metal lines are of equal length to each other, and
        each distinct metal line of the plurality of distinct metal lines serves as a horizontal interconnect.

2. The method of claim 1, wherein the first metal plate is disposed at an outer periphery of the active region at a distance of about 0 μm to about 10 μm from the active region.

3. The method of claim 1, wherein:
    the first metal plate interconnects sidewalls of the first metal lines.

4. The method of claim 1, wherein:
    the first metal lines and the first metal plate have substantially the same thickness.

5. The method of claim 1, wherein:
    the first metal lines and the first metal plate are integral with each other.

6. The method of claim 1, wherein the second metal plate is disposed at an outer periphery of the active region.

7. The method of claim 1, wherein the second metal plate is disposed at both outer and inner peripheries of the active region.

8. The method of claim 1, wherein the second metal is disposed at an inner periphery of the active region.

9. The method of claim 1, wherein an electric component is disposed in the active region.

10. The method of claim 9, wherein the electric component is a diode having an anode coupled to one metal line of the pair of first metal lines and a cathode coupled to one second metal line of the pair of second metal lines.

11. A method of fabricating a semiconductor device, the method comprising:
   forming a dielectric material above a substrate having an active region in which an electronic component is to disposed that includes opposite first and second edges;
   patterning the dielectric material to form a plurality of first holes therethrough;
   forming a first metal material over the dielectric material and in the first holes in the dielectric material; and
   removing the first metal material that is on the dielectric material, wherein the first metal material that is in the first holes in the dielectric material includes
      a pair of first metal lines that extend toward the second edge of the active region, and
      a first metal plate that horizontally interconnects the pair of first metal lines; and
   forming a plurality of distinct and equal length metal lines underneath all of the first pair of metal lines and under a subset of the first metal plate that are parallel to each other and arranged along a length of the active region such that each distinct metal line of the plurality of distinct metal lines serves as a horizontal interconnect by:
      forming a second dielectric material above the substrate;
      patterning the second dielectric material to form a plurality of second holes therethrough;
      forming a second metal material over the second dielectric material and in the second holes in the second dielectric material; and
      removing the second metal material that is on the second dielectric material;
   wherein:
      the second metal material that is in the holes in the second dielectric material includes
         a pair of second metal lines that extend toward the second edge of the active region, and
         a second metal plate that horizontally interconnects the pair of second metal lines of the second metal material; and
      the plurality of distinct metal lines have a length that extends, on a first end, from a position underneath an intermediate portion of the first metal plate to, on a second end, a position underneath an intermediate portion of the second metal plate.

12. The method of claim 11, wherein the first metal plate is disposed at an outer periphery of the active region at a distance of about 0 μm to about 10 μm from the active region.

13. The method of claim 11, wherein:
   the first metal plate interconnects sidewalls of the first metal lines.

14. The method of claim 11, wherein:
   the first metal lines and the first metal plate have substantially the same thickness.

15. The method of claim 11, wherein:
   the first metal lines and the first metal plate are integral with each other.

16. The method of claim 11, wherein the second metal plate is disposed at one or more of: an outer periphery or an inner periphery of the active region.

17. The method of claim 11, wherein a diode is disposed in the active region having an anode coupled to one metal line of the pair of first metal lines and a cathode coupled to one second metal line of the pair of second metal lines.

18. A system comprising:
   means for forming a dielectric material above a substrate having an active region in which an electronic component is to disposed that includes opposite first and second edges;
   means for patterning the dielectric material to form a plurality of holes therethrough;
   means for forming a first metal material over the dielectric material and in the holes in the dielectric material;
   means for removing the first metal material that is on the dielectric material, wherein the first metal material that is in the holes in the dielectric material includes
      a pair of first metal lines that extend toward the second edge of the active region, and
      a first metal plate that horizontally interconnects the pair of first metal lines;
   means for removing the second metal material that is on the second dielectric material, wherein the second metal material that is in the holes in the second dielectric material includes
      a pair of second metal lines that extend toward the second edge of the active region, and
      a second metal plate that horizontally interconnects the pair of second metal lines of the second metal material; and
   means for forming a plurality of distinct and equal length metal lines underneath all of the first pair of metal lines and the second pair of metal lines, wherein the plurality of distinct and equal length metal lines have a length that extends, on a first end, from a position underneath an intermediate portion of the first metal plate to, on a second end, a position underneath an intermediate portion of the second metal plate.

* * * * *